(12) United States Patent
Antic et al.

(10) Patent No.: US 11,105,837 B2
(45) Date of Patent: Aug. 31, 2021

(54) FREQUENCY MULTIPLYING DEVICE

(71) Applicant: Smart Grid Solutions GmbH, Frankfurt am Main (DE)

(72) Inventors: Boris Antic, Novi Sad (RS); Branislav Santrac, Novi Sad (RS)

( * ) Notice: Subject to any disclaimer, the term of this patent is extended or adjusted under 35 U.S.C. 154(b) by 140 days.

(21) Appl. No.: 16/604,285

(22) PCT Filed: Apr. 12, 2018

(86) PCT No.: PCT/EP2018/059421
§ 371 (c)(1),
(2) Date: Oct. 10, 2019

(87) PCT Pub. No.: WO2018/189310
PCT Pub. Date: Oct. 18, 2018

(65) Prior Publication Data
US 2020/0049747 A1 Feb. 13, 2020

(30) Foreign Application Priority Data
Apr. 13, 2017 (EP) .................................... 17000650

(51) Int. Cl.
*H03K 23/00* (2006.01)
*G01R 23/10* (2006.01)
(Continued)

(52) U.S. Cl.
CPC ......... *G01R 23/10* (2013.01); *H03K 5/00006* (2013.01); *H03K 5/24* (2013.01);
(Continued)

(58) Field of Classification Search
None
See application file for complete search history.

(56) References Cited

U.S. PATENT DOCUMENTS 3,484,712 A * 12/1969 Foote ........................ H03L 7/18
331/18
3,704,414 A * 11/1972 Herbst ................... G01R 23/10
324/76.48
(Continued)

FOREIGN PATENT DOCUMENTS

CN 203368401 U 12/2013
DE 3205296 A1 9/1983
(Continued)

OTHER PUBLICATIONS

Arithmetic Shift; Wikipedia; Jul. 1, 2015; https://en.wikipedia.org/w/index.php?title=Arithmetic_shift&oldid=669468544.

*Primary Examiner* — Tuan T Lam
(74) *Attorney, Agent, or Firm* — Howard IP Law Group, PC (57) ABSTRACT

The invention relates to a frequency multiplying device for determination of a fundamental frequency f of an analogue target signal. The device comprises a generating device for generating a reference signal having a frequency $f_{osc}$, wherein $f_{osc}$ is greater than f, and a first counter being coupled to a terminal, the terminal to be fed with the analogue target signal, and being coupled to the generating device such that the first counter counts a number of signal edges generated from the reference signal in a time interval corresponding substantially to 1/f and outputs a first counter signal, wherein a frequency divider is coupled between the generating device and the first counter and a second counter is coupled to the generating device for counting signal edges of a signal generated from the reference signal the second counter outputting a second counter signal and a comparator is coupled to the first counter to receive the first counter signal and coupled to the second counter to receive the second counter signal, wherein the comparator generates a signal in the event the first counter signal is equal to the second counter signal, and the output of the comparator is coupled to reset the second counter.

8 Claims, 3 Drawing Sheets

(51) Int. Cl.
*H03K 5/00* (2006.01)
*H03K 5/24* (2006.01)
*H03K 21/38* (2006.01)
*H03K 23/68* (2006.01)
*H03K 23/70* (2006.01)

(52) U.S. Cl.
CPC ........... *H03K 21/38* (2013.01); *H03K 23/002* (2013.01); *H03K 23/68* (2013.01); *H03K 23/70* (2013.01)

(56) References Cited

U.S. PATENT DOCUMENTS

| | | | | |
|---|---|---|---|---|
| 3,798,564 | A * | 3/1974 | Langham | G06F 7/68 |
| | | | | 331/1 A |
| 3,970,954 | A * | 7/1976 | Even | G06F 7/62 |
| | | | | 331/53 |
| 4,074,191 | A * | 2/1978 | Jules | G01R 23/10 |
| | | | | 324/76.29 |
| 4,704,723 | A * | 11/1987 | Markland | H03K 23/68 |
| | | | | 377/39 |
| 4,773,031 | A * | 9/1988 | Tobin | G06F 7/68 |
| | | | | 377/47 |
| 5,095,264 | A * | 3/1992 | Hulsing, II | G01R 23/10 |
| | | | | 324/76.47 |
| 5,442,278 | A * | 8/1995 | Fan Chiang | G01R 23/10 |
| | | | | 324/76.41 |
| 2007/0080724 | A1 | 4/2007 | Wadhea et al. | |
| 2015/0244375 | A1* | 8/2015 | Pelley | G01K 7/32 |
| | | | | 377/25 |

FOREIGN PATENT DOCUMENTS

| | | |
|---|---|---|
| FR | 2578369 A1 | 9/1986 |
| GB | 2052815 A | 1/1981 |
| JP | 2002232496 A | 8/2002 |

\* cited by examiner

FREQUENCY MULTIPLYING DEVICE

CROSS-REFERENCE TO RELATED APPLICATIONS

This application is the national stage application under 35 U.S.C. § 371 of International Application No. PCT/EP2018/059421 filed on Apr. 12, 2018, and claims the benefit of EP 17000650.6 filed on Apr. 13, 2017, the entire disclosures of which are incorporated herein by reference in their entireties.

The invention relates to a frequency multiplying device that can provide a signal, especially an analogue signal, with a multiple of a fundamental frequency. Further, the invention relates to a measurement system comprising the multiplying device and to the use of the frequency multiplying device and/or the measurement system. The invention also relates to a method for multiplying a fundamental frequency of an analogue signal and the use of a comparator for multiplying a fundamental frequency.

Frequency determining devices are usually able of determining frequency and phase information for signals and are utilised in a large variety of communication and power systems, electric and optical spectrometers as well as consumer electronic devices. They may also be applied for synchronising multiple signals at varying frequencies to a preset frequency. In some applications dealing with precise spectral (harmonic) measurements of voltages and/or currents based on Fourier expansion, an important problem is, not knowing the exact value of the fundamental frequency of the measured signal. The majority of applications restricted to environments with well-established nominal frequencies usually assume a known fundamental frequency as is the case in power grid measurements, where the fundamental frequency, that usually represents the main frequency, is adjusted to a nominal value of e.g. 50 Hz or 60 Hz in large parts of the world. In power grids, regulations for compensating fluctuations in electric consumption is performed with additional power generators or consumers at a level of several hundred megawatts which requires a phase aligned injection of the power into the power grid. The frequency in power grids is measured at an accuracy of typically ±1 mHz whereby the limits of frequency range allowed in normal operation according to the European norm are 49.8 Hz to 50.2 Hz. The measurement accuracy of standard electricity meters is optimized for exactly 50 Hz Experiments have shown that there are significant deviations of the measured power due to temporal fluctuations of the main frequency in a power grid.

The fundamental frequency instability is a main problem for Fourier expansion as it leads to many issues such as aliasing and leakage effect. These issues are known to the skilled person. Here, the most significant among them is usually the leakage effect or transfer of energy between spectral components due to the inability of the Fourier expansion to compensate for any discrepancy in assumed and actual fundamental frequency. Another issue is that the all spectral components will be falsely placed at wrong frequencies. If the actual value of the fundamental frequency is f and it differs from the nominal value $f_0$ for the amount $\Delta f$, then the frequency of the n-th harmonic will differ for the amount $n\Delta f$. Furthermore, for a uniform signal sampling it is required to ensure exactly the same number of samples over each period. Otherwise, measurements taken over identical signals under identical conditions will produce different measurement results.

All these phenomena pose obstacles to accurate measurements of positions and amplitudes of harmonics. The measurement error is increasing with a higher harmonic. This means that e.g. power and energy measurements inherently contain additional measurement inaccuracies. Knowing the exact fundamental frequency and uniform sampling with identical number of samples over each period are the prerequisites for the elimination of the measurement error due to the spectrum leakage. In order to achieve this it is necessary to adapt to small frequency variations e.g. by generating the exact multiple of the fundamental frequency of the measured signal and dynamically tuning the internal clock of the instrument to that frequency.

One common approach is to assume the known fundamental frequency and attempt to compensate the error with numerical post-processing of measurement results. Another possibility is to use frequency sweeping to measure the true spectrum of the signal, but this approach requires very fast and expensive circuitry. A frequency multiplier necessary to overcome the problems of spectrum leakage can be realized in several ways which are briefly explained below.

One known solution is the application of a series of switching (rectifying) semiconductor elements, each of which doubles the input frequency. This usually creates short, but unstable no-signal zones corresponding to non-conducting intervals around zero-crossing points. Depending on the noise level this can affect the stability of each element in a series and accumulate error when high multiples are required.

Another solution is the utilisation of non-linear elements, such as step recovery diodes or class C transistors to generate higher harmonics. The drawback of non-linear circuits is that the energy levels of harmonics of very high orders are usually too low and contain an unacceptable amount of noise for many applications. Additionally, they require relatively complex and expensive filters to filter out all undesired multiples of the fundamental frequency.

A further known approach is provided by analogue PLLs (Phase Locked Loops) with the voltage control oscillator set to the multiple of the input frequency. Frequency multiplication or synthesis through PLL means at least one whole period delay to any change at the input. US 2015/0054491 A1 for example discloses a special realisation of a system and method to detect the fundamental frequency of an electric input signal using a feedback control loop including a phase error detector, a loop controller, and a digitally controlled oscillator.

Another known technique is a microprocessor or DSP with arithmetical multiplication of the measured frequency and synthesis of an output signal corresponding to the result of that multiplication. These solutions are relatively complex and consume many resources to be integrated into less hardware demanding measurement devices e.g. such as compact handheld devices. For example US 2008/0232526 A1 discloses a method and apparatus for clocking a DSP at a frequency which is always a constant integer multiple of the fundamental frequency of the input analogue signal.

Further integrated frequency multipliers are known in the art. These integrated frequency multipliers have limited capabilities of multiplication factors up to 100, while e.g. in spectrometers or power grid instruments it is required that the frequency is multiplied by a factor of $1\text{-}10\times10^3$. Most frequency multipliers are produced for microwave RF modules and cover the range from 100 MHz to 24 GHz and thus can't be applied to low frequency multiplication.

None of the above mentioned concepts is satisfactory since the factor of the frequency multiplication is significantly lower than required for many applications as e.g. the measurement of the fundamental frequency. Such measurement for instance is required for precise digitisation.

FR 2 578 369 A1, GB 2 052 815 A, and DE 32 05 296 A1 disclose a frequency multiplying device for determination of a fundamental frequency f of an analogue target signal according to the preamble of claim 1.

Given this background, the problem to be solved by the invention is to provide a frequency multiplication that allows an improved measurement of frequencies. Preferably, the invention allows a fast and/or precise and/or easy to manufacture and at the same time low-cost measurement of the fundamental frequency of an analogue signal which can be measured more accurately than the frequency of the original of the analogue signal source. Another object of the solution is to allow for more compact and miniaturised measurement devices.

The general concept of the invention is to generate a reference signal with a frequency $f_{osc}$ and generate a further reference signal having a frequency $f_K$. The multiplication is independent from the reference signal but dependent from the ratio of the reference signal and the further reference signal. When providing the reference signal and the further reference signal substantially from the same source, a constant and/or pre-determined multiplication factor can be obtained. The frequencies of the reference signal and of the further reference signal doesn't have to be considered on their own. The inventors have for the first time realized that a counting of edges of a signal having a frequency $f_{osc}/K$ during a period of the target signal and counting the edges of a signal having a frequency $f_{osc}$ can obtain a signal having a multiple of the frequency of the target signal when comparing the two results and outputting a signal in case that the two counts are the same. Thus, even without knowing the frequencies of the reference signal and the further reference signal the multiplication of the frequency of the target signal will be of high accuracy, especially in case the reference signal is stable.

For the invention a simple hardware can be used which can be also implemented as a part of an integrated circuit. The invention allows for a device, where there is no substantial delay in information propagation from the input to the output allowing fast reactions. If the fundamental frequency changes from cycle to cycle, the measurement ends precisely at the end of the signals period. Another advantage is that the information on the frequency ratio is available in digital form. Further, the multiplication factor is arbitrarily high and is preferably in the range of approximately 2 to $10^5$. The increase in multiplication factor does not require an increase in complexity of the hardware. Another benefit of the invention is that it allows the generation of a digital signal with for instance 50/50% filling factor with significant power to trigger outside circuitry.

This opens up a variety of new applications for highly precise measurement of a fundamental frequency since higher frequencies often allow lower errors of preferably less costly hardware for e.g. digitisation and/or frequency determination. By changing an input filter and/or by changing a division factor K of a frequency divider that is preferably integrated in the proposed circuit, the circuit can also be applied in any instrument measuring harmonics such as in EMC testers and RF immunity testing on demand, or for evaluating harmonics in aircraft equipment in which the fundamental frequency may easily change to other harmonics. Alternatively, such instruments can be used to observe changes in the harmonic distortion factor in each phase of semiconductor components and non-linear input elements.

In audio analyzers the invention can be applied for determining the distortion factor of audio signals since this typically requires an exact determination of the fundamental frequency, but the invention can also be utilised in frequency multiplexers and demultiplexers when significant signal dispersion is expected.

The signal generated by the proposed frequency multiplying device is suitable for determination of the fundamental frequency f of the analogue target signal.

The elements of the frequency multiplying device can be integrated circuits, especially the elements specified in the description are separate integrated circuits forming a larger circuit. Preferably, the elements specified in the description can be identified in the integrated circuit as such.

The notion "coupled" denotes an electrical connection between two elements which may be a direct connection, but can also comprise further active or passive electric or electronic elements for adapting and optimizing an electrical signal between the two elements (indirect connection).

The term "generating device" encompasses a frequency generator or oscillator or clock that preferably has a high temporal stability. The "generating device" can provide a stable reference signal, including periodic and partly non-periodic signals, especially with regard to amplitude.

Furthermore, the term "frequency divider" refers to an electronic device which is adapted to divide the frequency of an input signal by a factor K, wherein K is an integer, but K can—in general—also comprise a real or complex number in particular when an electric component also generates a phase shift that can be incorporated in an imaginary part of a number. It also has to be considered that every electrical component referred to in this description can comprise an impedance, which means a complex resistance that can cause a change of amplitude and phase. In the same way, each electrical component can comprise not only a linear, but also a non-linear behavior. Non-linear in the context of electrical components or elements denotes, that for instance new frequencies are generated that were not available in the input signal of the specific electrical component before.

The term "counter" encompasses an electronic device which is adapted to count events in a signal, especially rising or falling edges. A counter can be a binary or digital counter. A binary counter can be constructed by a number of flip-flops connected in cascade. A binary or digital counter can be a common integrated circuit having a "RESET" (reset) input, a "UP" input, a "CLK" (clock) input and an output.

The term "comparator" encompasses an electronic device which is adapted to compare two inputs. A comparator can be a common integrated circuit having two inputs "A" and "B" as well as a "CLK" (clock) input and an output. The term comparator encompasses a digital or binary comparator.

The term "correspond" in the entire description of the patent comprises the meaning of "relate" and/or "substantially equal" and/or "substantially proportional".

In the description, the term "trigger" encompasses an integrated circuit which is adapted to extract the fundamental frequency of an input signal. The term "trigger" encompasses a Schmitt trigger or any other kind of trigger circuit. Further, the term "trigger" can encompass that input signal is previously, simultaneously or subsequently filtered, especially low pass filtered.

In a preferred embodiment of the invention, the proposed frequency determining multiplying device for determining a fundamental frequency f of an analogue target signal comprises at least a signal input (A) that is connected to a trigger-, which is subsequently connected to a first counter.

The trigger converts said analogue input signal to a digital output signal (C). The circuit further comprises a generating device for generating a reference signal (G) having a frequency $f_{osc}$ higher than the fundamental frequency f of the target signal. The reset input of the first counter is coupled to the trigger and the clock input of the first counter is coupled to the generating device. The output (E) of the counter can have a maximal decimal value N. Subsequent to the counter the output can be coupled to a first input A of the comparator, wherein a latch register can be coupled between the first counter and the comparator for receiving and storing the digital output (E) of the first binary counter. The frequency of the reference signal (G) is divided by K and the corresponding signal is received by the clock input of the first counter. Further, the reference signal (G) is received by the clock input of the comparator and by the clock input of the second counter, said second counter generates an output signal (I) and is coupled to a second input B of the comparator comparing the output (I) with the digital values (F) of the latch register coupled to the first input A of the comparator. Said comparator generates an analogue output signal (J) having a frequency that is a multiple of the fundamental frequency of the analogue input signal (A). Further the analogue output signal serves as a reset signal for the second counter.

Thus, the comparator can be provided in a negative reset loop. The comparator can be provided in a negative reset loop connected to the second counter to reset the second counter.

Preferably, the first and second counter have an edge-triggered "RESET" input. In an advantageous realization, both counters are set to logical "1" so that the counters always count up. The digital comparator preferably has an edge-triggered "CLK" input. The generating device provides a frequency that is usually significantly higher than the fundamental frequency that needs to be detected precisely. In a preferred embodiment, the reference signal generating device generates a highly stable frequency with a Q factor preferably lower or equal to 1 ppm and the temperature parabolic factor better than 0.1 ppm/° $C.^2$.

Preferably, the edge triggered clock input of the first binary counter is inverted that may improve also the stability of the signal.

In a preferred embodiment, the frequency multiplying device has a latch register coupled to the output of the first counter. By this, the results of the counter can be stored and used with a time shift, especially when the values are required later. Furthermore, depending on the read and write method, values can also be amended or provided in other formats. The count of the first counter stored in the latch register can correspond to the ratio of two frequencies at inputs "CLK" and "RESET" and thus can represent the ratio of the frequency $f_{osc}$ of the reference signal (G) and the fundamental frequency f given by $f_{osc}/(K \cdot f)$.

In a preferred embodiment the latch register is a latch and shift register. Thus, if a latch register is mentioned in the description it can also refer to a latch and shift register. By a latch and shift register the bits can be shifted to the right. The shifting will be explained below.

In a further preferred embodiment, the output of the first counter is divided by D1 before in particular led to the latch register. Preferably D1 is an integer power of 2. Preferably, this is achieved by shifting the bits log 2(D1) places to the right, preferably by one place to the right in case D1 is equal to 2, or generally an integer power of 2. In other words, the MSB of the output of the first counter is coupled to the MSB-1 bit of the latch register. The MSB-1 bit of first counter is coupled to the MSB-2 bit of the latch register etc., until the LSB+1 bit of the first counter is coupled to the LSB of the latch register. The last LSB bit of the first counter is not coupled to the latch register. Alternatively, a division by 4, 8, 16, etc. is possible as the same method can be performed for other factors D1 that can be represented by $2^n$, where n denotes a natural number.

In another preferred embodiment, the output of the comparator is coupled to a frequency divider with the factor D2, preferably dividing by a factor of D2=2, resulting in an analogue signal (K). Alternatively, a division by 4, 8, 16, etc. is possible as the same method can be performed for other factors that can be represented by $2^n$, where n denotes a natural number. Preferably, the factor of the frequency divider corresponds to or is equal to the factor with that the output of the first counter (E) is changed, especially by the aforementioned method of shifting.

In a further preferred embodiment, the output of the reference signal module is coupled to an inverter. The inverter can be realized as an inverted amplifier. The inverter can stabilise the signal due to the typical characteristics of an amplifier circuit.

In another preferred embodiment, the signal (C) is delayed by a delay circuit generating the output signal (D) led to the reset input of the first counter. The delay assures that the latch register is free to receive the signal from the first counter and is typically much shorter than one measurement cycle.

In another preferred embodiment, the input signal (A) is filtered by a low pass filter before entering the trigger circuit in order to suppress higher unwanted harmonic frequencies as well as noise which may cause error in the measurement circuit. The corresponding cut-off frequency of the low pass filter usually corresponds to a lower frequency than the maximum frequency that measurement circuit can handle correctly.

In a particularly preferred embodiment, the output signal (K) has a frequency that is a K-multiple of the fundamental frequency f. The signal (G) having the reference oscillator's frequency $f_{osc}$ preferably drives the second counter which is counting up in particular at a much higher rate. Preferably whenever the output of the second counter and the latch register are equal (both are at N/2), the comparator generates a relatively short RESET signal (J) at its "A=B" output. This signal typically resets the second counter to zero and the counting of that counter will continue. Within one period of the input signal (A) the second counter will reset exactly 2K times because it corresponds to the ratio of frequencies $f_{osc}$ and f/2 due to the division by 2 (right shifting) prior to coping the value into the latch register. The "A=B" output of the digital comparator is led to a frequency divider by factor 2 to obtain the signal (K) with 50/50% fill ratio. Signal (K) is the analogue output signal with the frequency of K·f.

The invention furthermore provides a measurement device with a frequency multiplying device according to the description. The corresponding measurement device can be applied for example in EMC testers and RF immunity testing on demand, for application was in a generator to detect the shifting power grid frequency and synchronise its generated electricity to the grid frequency for injection, for precise measurement of consumed power in AC-grids, for evaluating harmonics in aircraft equipment in which the fundamental frequency easily changes to harmonics, in instruments used to observe changes in the harmonic distortion factor in each phase of semiconductor components and non-linear four input elements, in audio analysers determining the distortion factor of audio signals as well as in frequency multiplexers and demultiplexers when significant signal dispersion is expected. The measurement device can comprise a frequency determining device which is adapted to determine the frequency of the signal generated by the frequency multiplying device.

The invention also provides the use of a comparator for multiplying a fundamental frequency f of an analogue target, wherein a reference signal with a frequency $f_{osc}$, the frequency $f_{osc}$ being higher than the frequency f, is generated and a further reference signal which is the reference signal having a frequency $f_K$, which is $f_{osc}/K$, is generated, and signal edges of a signal corresponding to the further reference signal during a time interval which relates to a period of the analogue target signal are counted, and signal edges of a signal corresponding to the reference signal are counted, the comparator is used to compare counting signals of the two counting steps, and is used to generate a signal which corresponds to the counting signals and used to reset the counting of the signal edges of the counting signal corresponding to the reference signal.

Furthermore, the invention also provides a method for multiplying a fundamental frequency f of an analogue target signal. The method comprises the steps of: generating a reference signal with a frequency $f_{osc}$, the frequency $f_{osc}$ being higher than the frequency f and generating a further reference signal which is the reference signal having a frequency $f_K$, which is $f_{osc}/K$, counting signal edges of a signal corresponding to the further reference signal during a time interval which relates to a period of the analogue target signal, counting signal edges of a signal corresponding to the reference signal, generating counting signals of the two counting steps, and comparing the counts of the two counting steps, wherein a signal is generated which corresponds to the counting signals and output as a signal corresponding to the output signal and used to reset the counting of the signal edges of the counting signal corresponding to the reference signal.

Furthermore, the application provides the following embodiments:

1. A frequency multiplying device for determination of a fundamental frequency f of an analogue target signal, the device comprising
    a generating device (6) for generating a reference signal having a frequency $f_{osc}$, wherein $f_{osc}$ is greater than f,
    a first counter (5) being coupled to a terminal, the terminal to be fed with the analogue target signal, and being coupled to the generating device (6) such that the first counter (5) counts a number of signal edges generated from the reference signal in a time interval corresponding substantially to 1/f and outputs a first counter signal wherein
    a frequency divider (8) is coupled between the generating device (6) and the first counter (5) and
    a second counter (9) is coupled to the generating device (6) for counting signal edges of a signal generated from the reference signal the second counter outputting a second counter signal and
    a comparator (10) is coupled to the first counter (5) to receive the first counter signal and coupled to the second counter (9) to receive the second counter signal, wherein the comparator (10) generates a signal in the event the first counter signal is equal to the second counter signal, and the output of the comparator (10) is coupled to reset the second counter (9).
2. Frequency multiplying device recited in claim 1, having a latch register (4) coupled to the output of the first counter (5).
3. Frequency multiplying device recited in one of the aforementioned claims, wherein the output of the first binary counter (5) is divided by a factor of D1, preferably 2.
4. Frequency multiplying device recited in one of the aforementioned claims, wherein the output of the digital comparator (10) is coupled to a frequency divider (11), dividing by a factor of D2, preferably 2.
5. Frequency multiplying device recited in one of the aforementioned claims, wherein the clock (6) is coupled to an inverter (7).
6. Frequency multiplying device recited in one of the aforementioned claims, wherein the output of the trigger (2) is coupled to a delay circuit (3) and the output of said delay circuit (3) is coupled to the reset input of the first binary counter (5).
7. Frequency multiplying device recited in one of the aforementioned claims, wherein the input signal (A) is coupled to a low pass filter (1).
8. Measurement system comprising the frequency multiplying device according to anyone of claims 1 to 7.
9. Use of the frequency multiplying device according to anyone of the claims 1 to 7 and/or the measurement system according to claim 8 for measuring.
10. A method for multiplying a fundamental frequency f of an analogue target signal, the method comprising the steps of: generating a reference signal with a frequency $f_{osc}$, the frequency $f_{osc}$ being higher than the frequency f and generating a further reference signal which is the reference signal having a frequency $f_K$, which is $f_{osc}/K$, counting signal edges of a signal corresponding to the further reference signal during a time interval which relates to a period of the analogue target signal, counting signal edges of a signal corresponding to the reference signal, generating counting signals of the two counting steps, and comparing the counts of the two counting steps, wherein a signal is generated which corresponds to the counting signals and output as a signal corresponding to the output signal and used to reset the counting of the signal edges of the counting signal corresponding to the reference signal.
11. Use of a comparator (10) for multiplying a fundamental frequency f of an analogue target signal, wherein a reference signal with a frequency $f_{osc}$, the frequency $f_{osc}$ being higher than the frequency f, is generated and a further reference signal which is the reference signal having a frequency $f_K$, is generated, and signal edges of a signal corresponding to the further reference signal during a time interval which relates to a period of the analogue target signal are counted by a first binary counter (5), and signal edges of a signal corresponding to the reference signal are counted by a second binary counter (9), the comparator (10) is used to compare counting signals of the two counting steps, and is used to generate a signal which corresponds to the counting signals and used to reset the second counter (9).

Exemplary embodiments of the invention will now be described in greater detail with reference to the drawings.

Figure 1:
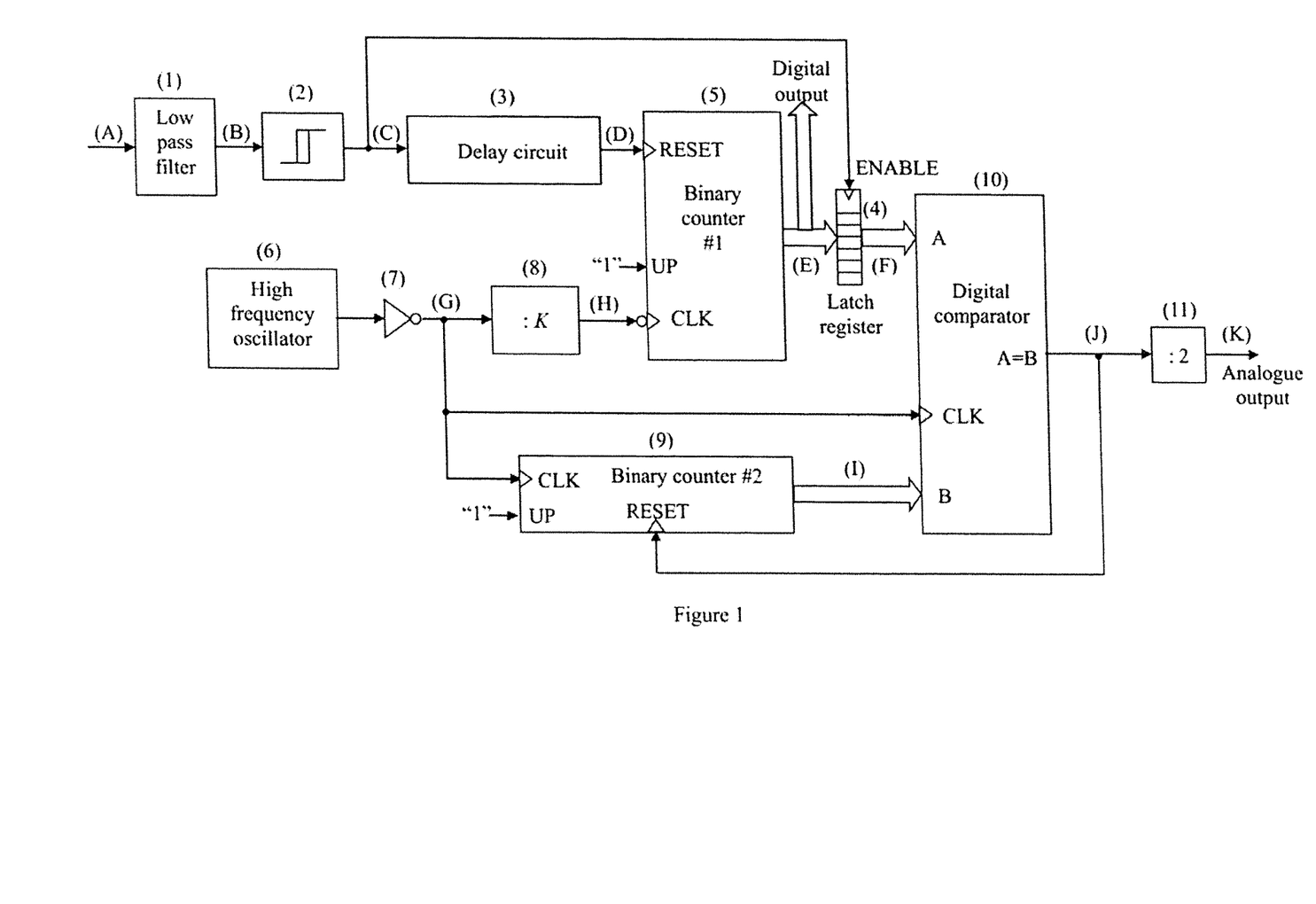
FIG. 1 shows a block diagram of the frequency multiplying device according to an embodiment of the present invention.

In FIG. 1, an embodiment according to the invention is shown. An analogue input is fed into a low pass filter 1. The output of the filter 1 is coupled to the input of a Schmitt-trigger 2 or a comparator in general. The output of the Schmitt-trigger 2 is coupled to the input of a delay circuit 3 and the edge-triggered "ENABLE" input of a latch register 4. The delay circuit 3 is coupled to the edge-triggered "RESET" input of a first binary counter 5. The "UP" input of said first binary counter 5 is coupled to logical 1 so that counter 5 always counts up. The output of a high frequency oscillator 6 is coupled to the input of an inverter 7. The output of the inverter is fed into a frequency divider 8 (the factor of the frequency divider is K), and thereby to the edge-triggered "CLK" input of a digital comparator 10, and also to the edge-triggered "CLK" input of a second binary counter 9. The digital output of the first binary counter 5 can serve as a digital output of the circuit. The digital output of the first binary counter 5 is also fed into a latch register 4 by shifting the bits one place to the right, so that the MSB of the output of the first binary counter 5 is coupled to the MSB-1 bit of the latch register 4, whereby MSB denotes most significant bit. The MSB-1 bit of 5 is coupled to the MSB-2 bit of 4 and so on, until the LSB+1 bit of 5 is coupled to the LSB of 4, whereby LSB denotes least significant bit. The last LSB bit of the first binary counter 5 is not coupled to 4. The output of the frequency divider 8 is coupled to the inverted edge-triggered "CLK" input of the first binary counter 5. The digital output of 4 is coupled to the digital input "A" of the digital comparator 10 and the digital output of the second binary counter 9 is coupled to the digital input "B" of the digital comparator 10. The "A=B" output of the digital comparator 10 is coupled to the "RESET" input of the second binary counter 9 and to the input of a frequency divider 11 by 2. The output of the frequency divider 11 by 2 is the analogue output of the circuit and it generates the desired K multiple of the input signal.

Figure 2:
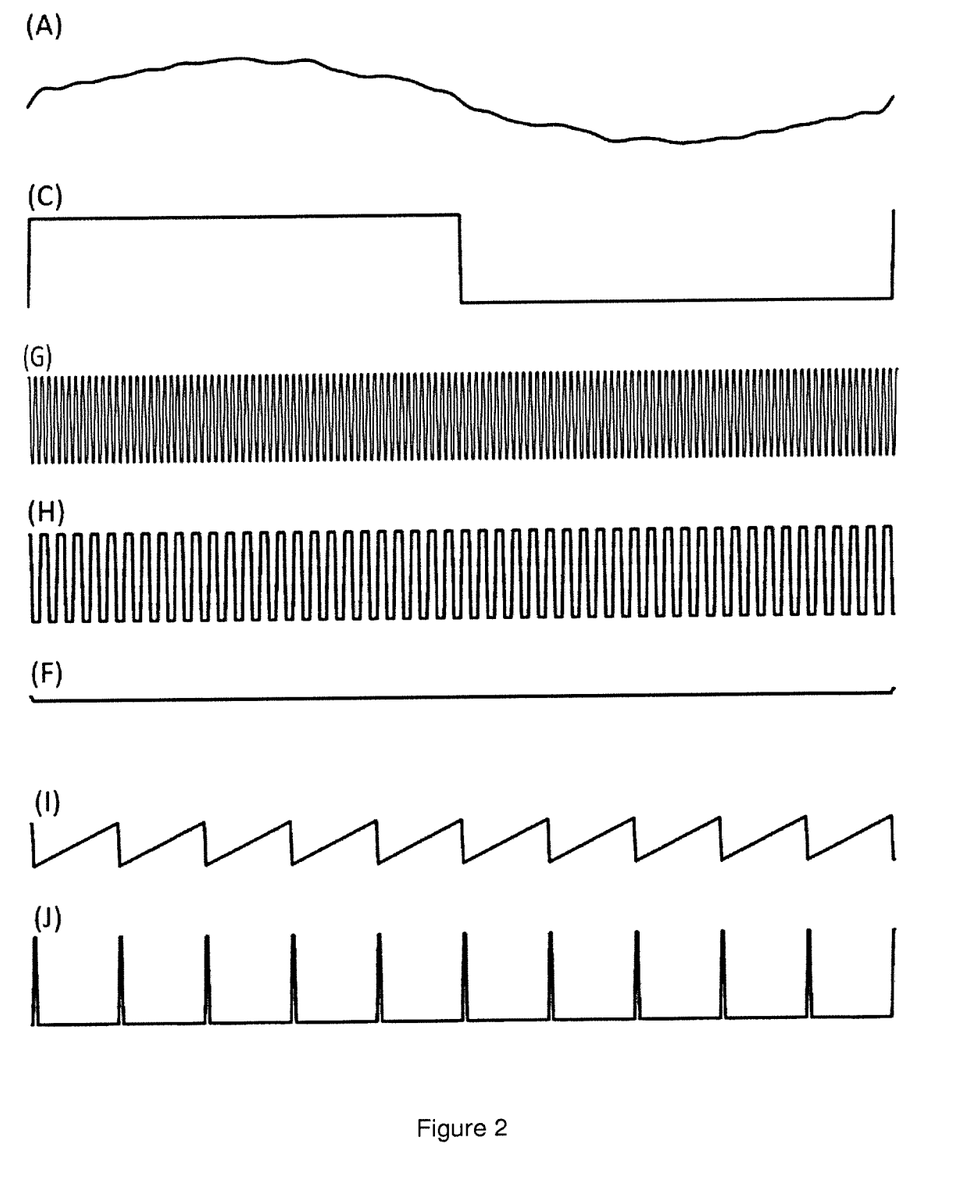
FIG. 2 illustrates the signals related to the block diagram of FIG. 1.

FIG. 2 shows an illustration of the signals from FIG. 1. The circuit from FIG. 1 uses a high-frequency reference oscillator with the frequency $f_{osc}$ and a frequency divider with the factor K to generate a K multiple frequency of an unknown fundamental frequency of the input signal A. The reference frequency and the multiplication factor have to be set in advance, but the principle of operation is independent on the choices of $f_{osc}$ and K. The input signal A should be any periodic signal which fundamental frequency f is unknown. The circuit can provide two outputs: one digital output (E) corresponding to the ratio of the unknown frequency f and the frequency $f_{osc}/K$ and one analogue output K—the digital clock signal having 50/50% fill ratio and the fundamental frequency equal to K·f.

The signal of the reference oscillator 6 is first inverted and by this preferably also stabilized by application of an inverter 7 and then led to a frequency division circuit 8 with the factor K. The signal H at the output of the frequency divider 8 is used to trigger counting of the first binary counter 5. The binary counter will count upward because its "UP" input is coupled to a logical "1", as long as the signal D passes through one period.

Signal D is obtained from the input signal A. First, the signal A with the unknown fundamental frequency f passes through a low-pass filter 1 to suppress noise and higher harmonics. The low-pass filter 1 produces signal B, which is then coupled to the input of a Schmitt-trigger circuit 2 to obtain square pulses C with frequency equal to f. This signal is used to enable the transfer of the output of first binary counter 5 into a latch register 4, where it is kept until the end of the cycle defined by the fundamental frequency f. A slightly delayed signal D is led to the RESET input of the first binary counter 5 to allow for a good synchronization with the latch register precisely at the end of the cycle. The delay should be shorter than the period of the signal H but longer than the speed of the latch register 4.

Besides latching, the output of the first binary counter 5 is divided by 2 before led to the latch register 4. This is achieved by shifting the bits one place to the right. In other words, the MSB of the output of 5 is coupled to the MSB-1 bit of the 4, The MSB-1 bit of 5 is coupled to the MSB-2 bit of 4 and so on, until the LSB+1 bit of 5 is coupled to the LSB of 4. The last LSB bit of the first binary counter 5 is not coupled to 4. Let integer number "N" denote the maximal decimal value of the first binary counter 5 at the moment of latching. N is the ratio of two frequencies at inputs "CLK" and "RESET" and equals $f_{osc}/(K \cdot f)$. Then the value copied into the latch register equals $N/2=f_{osc}/(2K \cdot f)$.

On the other hand, the signal G having the reference oscillator's frequency $f_{osc}$ drives the second binary counter 9 which is counting up at a much higher rate. Whenever the output of the second binary counter 9 and the latch register 4 are equal (both are at N/2) the digital comparator 10 will generate a short RESET signal J at its "A=B" output. This signal will reset the second counter 9 to zero and the counting of that counter will continue. Within one period of the input signal A the second binary counter 9 will reset exactly 2K times because it corresponds to the ratio of frequencies $f_{osc}$ and f/2 due to the division by 2 (right shifting) prior to coping the value into the latch register 4. The "A=B" output of the digital comparator 10 is led to a frequency divider by factor 2 to obtain the signal K with preferably 50/50% fill ratio. Signal K is the analogue output signal with the frequency of K·f.

Figure 3:
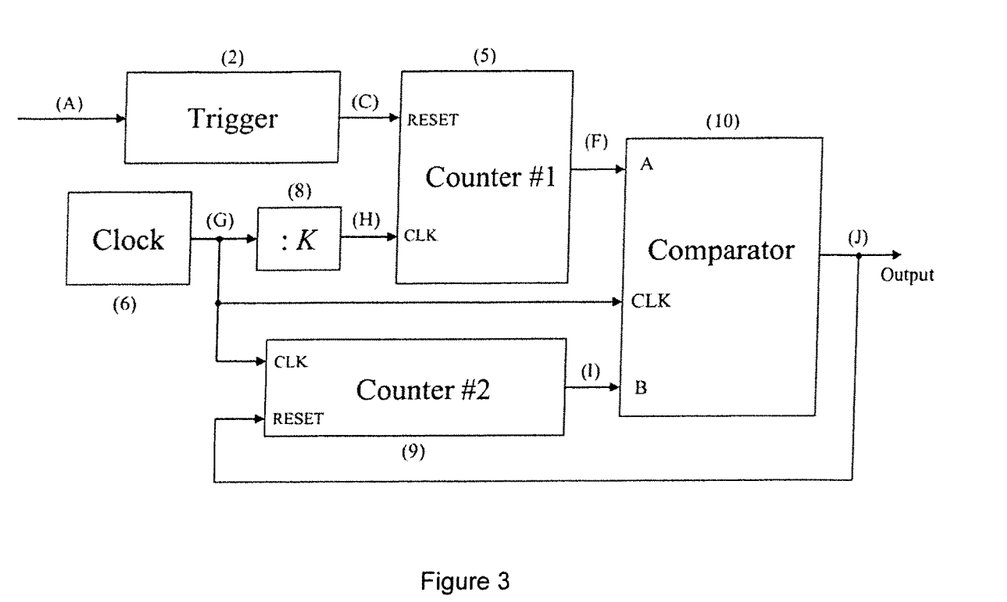
FIG. 3 shows a block diagram of the frequency multiplying device in a simplified embodiment of FIG. 1.

FIG. 3 shows a block diagram of a simplified second embodiment of the frequency multiplying and/or determining device to illustrate the measurement method. Here, the Schmitt trigger 2 is replaced by a general trigger and the reference signal generating device is given by a general clock 6. The arrows indicate a coupling or transferring of signals, that also can comprise a change of the signals by other additional electrically active components.

The invention claimed is:

1. A frequency multiplying device for determination of a fundamental frequency f of an analogue target signal, the device comprising
    a generating device for generating a reference signal having a frequency $f_{osc}$, wherein $f_{osc}$ is greater than f,
    a first counter being coupled to a terminal, the terminal to be fed with the analogue target signal, and being coupled to the generating device such that the first counter counts a number of signal edges generated from the reference signal and outputs a first counter signal
    a frequency divider being coupled between the generating device and the first counter and
    a second counter being coupled to the generating device for counting signal edges of a signal generated from the reference signal the second counter outputting a second counter signal and
    a comparator with a first input (A) coupled to the first counter to receive the first counter signal and with a second input (B) coupled to the second counter to receive the second counter signal, wherein the comparator is configured to generate a signal to an output of the comparator in the event the first counter signal is equal to the second counter signal, and with an output of the comparator being coupled to reset the second counter, wherein
the frequency multiplying device has a latch register with an input and an output, the input coupled to the output of the first counter, which is adapted to count the number of signal edges generated from the reference signal in a time interval equal to 1/f, and the output coupled to the first input (A) of the comparator, wherein the output from the first binary counter is divided by a factor of D1, that is an integer power of 2, in the latch register that is configured to shift the bits by log 2(D1) places.

2. Frequency multiplying device according to claim 1, wherein the output of the comparator is also coupled to a frequency divider, dividing by a factor of D2.

3. Frequency multiplying device according to claim 1, a clock with an output for a clock signal is coupled to an inverter.

4. Frequency multiplying device according to claim 1, further comprising a trigger the trigger having an output and an input, the input being coupled with an input signal (A) and the output being coupled to a delay circuit and the output of said delay circuit being coupled to a reset input of the first binary counter.

5. Frequency multiplying device according to claim 4, wherein the input signal (A) is coupled to a low pass filter having an output to the trigger.

6. Measurement system comprising the frequency multiplying device according to claim 1.

7. A method for multiplying a fundamental frequency f of an analogue target signal, the method comprising the steps of: generating a reference signal with a frequency $f_{osc}$, the frequency $f_{osc}$ being higher than the frequency f and generating a further reference signal which is the reference signal having a frequency $f_K$, which is $f_{osc}/K$, counting signal edges of a signal corresponding to the further reference signal during a period of the analogue target signal, counting signal edges of a signal corresponding to the reference signal, generating counting signals of the two counting steps, and comparing the counts of the two counting steps, wherein a signal is generated which corresponds to the counting signals and output as a signal corresponding to the output signal and used to reset the counting of the signal edges of the counting signal corresponding to the reference signal, wherein the first counting signal is divided by D1 in a latch register (4), wherein D1 is an integer power of 2, the latch register configured to shift the bits in the latch register log 2(D1) places to the right.

8. Frequency multiplying device according to claim 1, wherein the comparator is a digital comparator, and the output of the digital comparator is also coupled to a frequency divider, dividing by a factor of 2.

* * * * *